United States Patent
Wen et al.

[11] Patent Number: 5,877,560
[45] Date of Patent: Mar. 2, 1999

[54] FLIP CHIP MICROWAVE MODULE AND FABRICATION METHOD

[75] Inventors: Cheng P. Wen, Mission Viejo; Kuo-Hsin Li, Irvine; Wah S. Wong, Montebello, all of Calif.

[73] Assignee: Raytheon Company, Lexington, Mass.

[21] Appl. No.: 803,655

[22] Filed: Feb. 21, 1997

[51] Int. Cl.[6] .................. H01L 23/488; H01L 23/50; H05K 1/18

[52] U.S. Cl. .................. 257/778; 257/762; 257/780; 257/772; 361/743; 361/764; 361/783

[58] Field of Search .................. 257/778, 762, 257/780, 772; 361/743, 764, 783

[56] References Cited

U.S. PATENT DOCUMENTS

| | | | |
|---|---|---|---|
| 3,798,135 | 3/1974 | Bracken | 257/758 |
| 3,866,311 | 2/1975 | Salles | 257/758 |
| 4,967,313 | 10/1990 | Berner | 361/783 |
| 5,130,779 | 7/1992 | Agarwala et al. | 257/772 |
| 5,308,998 | 5/1994 | Yamazaki et al. | 257/66 |
| 5,726,501 | 3/1998 | Matsubara | 257/778 |
| 5,729,896 | 3/1998 | Dalal | 257/772 |

*Primary Examiner*—Jerome Jackson, Jr.
*Attorney, Agent, or Firm*—Leonard A. Alkov; William C. Schubert; Glen H. Lenzen, Jr.

[57] ABSTRACT

A monolithic flip chip microwave integrated circuit module formed using titanium coated copper circuitry and a processing method. A dam is formed on a substrate by forming a thin protective layer such as titanium or other metal on a copper layer formed on a surface of the substrate to which a monolithic microwave integrated circuit is to be attached. The protective layer is oxidized upon exposure to air. Vias or openings are then formed in the oxidized protective layer. Solder is disposed in the openings in the oxidized protective layer, and is confined to the openings while solder is reflowed to attach the integrated circuit to the substrate. The oxidized protective layer serves a dual function that provides both a solder dam and a protective coating for the underlying copper circuitry. Copper surfaces not covered by the oxidized protective layer may be environmentally protected by depositing a thin layer containing electroless plated nickel and electroless plated gold.

3 Claims, 2 Drawing Sheets

FLIP CHIP MICROWAVE MODULE AND FABRICATION METHOD

BACKGROUND

The present invention relates generally to monolithic microwave integrated circuits, and more particularly, to a monolithic microwave integrated circuit module fabricated using tin based (Pb/Sn) solder technology and a method of fabricating same.

Flip chip monolithic microwave integrated circuit with plated silver thermal bumps are attached to microwave module substrates with gold based metallization using solder reflow techniques. Dielectric solder dams are provided on the metal patterns of the substrate to confine the spread of solder during the reflow process. Lead/indium solder is used to avoid the potential reliability hazard associated with gold/tin intermetallics.

The prior art is incompatible with tin based (Pb/Sn) solder techniques, and thus indium solder technology has been used for MMIC flip chip attachment. There is no commercial technique to plate indium solder, a process critical to millimeter-wave flip chip assemblies. Also, the use of gold based circuitry on an insulating substrate is more costly than the use of copper based circuitry. Pattern definition of dielectric (glass) solder dams also poses a lower limit on usable bump dimensions. Bump size reduction is critical to flip chip MMIC die size and module cost reduction.

Gold based circuitry is commonly used in both monolithic microwave integrated circuits (MMICs) and hybrid microwave assemblies because of the corrosion resistance property of gold. The same metal scheme is frequently used in traditional flip chip MMICs and flip chip microwave assemblies. Gold is also compatible with gold bond wires for off-chip electrical interconnections.

Indium based solder (i.e. 50/50 Pb/In) is used in place of more common tin based solder for these microwave assemblies because of reliability concerns of gold-tin compounds with high gold content. In particular, the gold-tin compound can become brittle, which is a potential cause of solder joint failure. In addition, dielectric (i.e. glass, polyimide, etc.) solder dams are needed to prevent solder from spreading on the surface of the microwave integrated circuit substrate during solder reflow. Therefore, lead indium (Pb/In) solder, which is more compatible with gold based metallization, is generally used for flip chip MMIC attachment.

Development of lower cost, higher frequency (millimeter wave), high power MMIC flip chip attachment techniques requires the use of chips with plated solder caps. Lack of Pb/In solder plating technology hinders the advancement of flip chip monolithic microwave integrated circuits, the most promising microwave module manufacturing technology of the future.

Accordingly, it is an objective of the present invention to provide for an improved monolithic microwave integrated circuit module fabricated using tin based (Pb/Sn) solder technology and a method of fabricating same.

SUMMARY OF THE INVENTION

To meet the above and other objectives, the present invention provides for the use of titanium coated copper based circuitry for solder reflow, flip chip, monolithic microwave integrated circuit attachment to form a monolithic flip chip microwave integrated circuit module. A dam is formed on a substrate by forming a protective layer such as a thin layer of titanium or other metal on a surface of the substrate to which a monolithic microwave integrated circuit is to be attached. The titanium (or other metal) thin protective layer is subsequently oxidized upon exposure to air. Vias or openings are then formed in the oxidized protective layer. Solder is disposed in the openings in the oxidized protective layer, and is confined to the openings while the solder is reflowed to attach the monolithic microwave integrated circuit to the substrate. The oxidized protective layer serves a dual function that provides both a solder dam and a protective coating for the underlying copper circuitry. Copper surfaces not covered by the oxidized protective layer may be environmentally protected by depositing a thin layer comprising electroless plated nickel and electroless plated gold.

More particularly, the flip-chip monolithic microwave integrated circuit module constructed in accordance with the present invention includes a substrate having copper circuitry disposed thereon. An oxidized thin film of titanium or other metal is disposed on a surface of the substrate having vias formed therein that form a dam for solder. Solder is disposed in the openings in the oxidized titanium thin film. The flip-chip monolithic microwave integrated circuit is soldered to the substrate by means of the solder disposed in the openings in the oxidized titanium thin film. This forms a complete monolithic flip chip microwave integrated circuit module.

Replacement of gold based, flip chip, microwave integrated circuitry with a copper based system allows the use of the more mature, tin based (Pb/Sn) solder in place of conventionally employed indium based solder. Availability of Pb/Sn solder plating techniques will enhance advanced, millimeter-wave flip chip MMIC technology development.

The present invention thus allows the use of well developed tin based (Pb/Sn) solder technology, including solder plating techniques, to fabricate flip chip MMICs with plated solder bumps, while retaining the corrosion resistance property of the microwave integrated circuit substrate. The present invention also eliminates the need for dielectric solder dams, whose pattern definition problem becomes very challenging for reduced size bumps required for millimeter-wave frequency flip chip assemblies.

The replacement of traditional gold based circuitry by copper based substrates that are compatible with established tin based solder techniques will make flip chip MMIC manufacturing processes more robust. The present invention will thus help to accelerate the development of millimeter-wave flip chip MMIC assembly technology.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Figure 1:
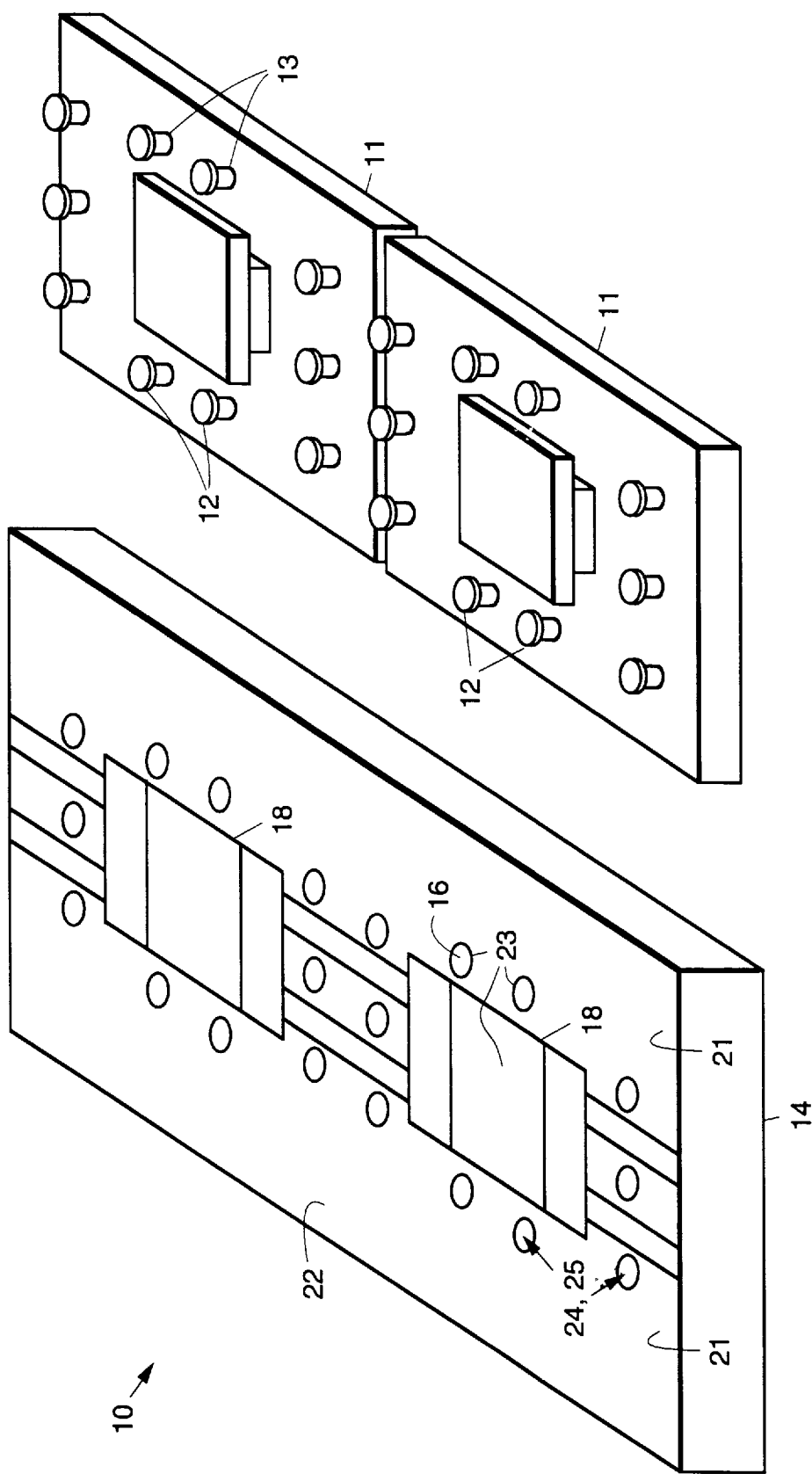
FIG. 1 is a perspective view showing a flip chip monolithic microwave integrated circuit module having plated solder caps disposed on silver bumps that is produced using a method in accordance with the principles of the present invention.

An understanding of the surface tension of melted solder in the solder reflow, flip chip microwave module integrated circuit (MMIC) attachment process investigated by the present inventors has resulted in the development of a single-step, low-cost, self-aligned, multi-chip microwave module assembly fabrication technique and improved microwave module 10. Referring to the drawing figures, FIG. 1 is a perspective view of a flip chip monolithic microwave integrated circuit module 10 that is constructed in accordance with the principles of the present invention. FIG. 1 shows two integrated circuits 11 having a plurality of plated solder caps 12 disposed on silver bumps 13 that are produced in a conventional manner. The plated solder caps 12 and bumps 13 are used to interconnect the integrated circuits 11 to a substrate 14 using a conventional solder reflow process. The integrated circuit module 10 includes a microwave assembly substrate 14 onto which the integrated circuits 11 are connected.

By way of background, and with specific regard to a conventionally processed substrate, in the prior art, patterns of solder paste comprising a solder and solder flux mixture, were printed on a surface of a substrate with the aid of a solder stencil. Solder dams, typically having a donut shaped dielectric thin film pattern, are used to confine the spread of solder on the circuit pattern during the reflow process.

The minimum dimension of the bumps (and the solder paste pattern) is limited by the finite size of the solder spheres in the paste. The solder spheres have a diameter of approximately 25 microns when used to produce a typical flip chip integrated circuit module 10. It is also difficult to maintain uniformity (the amount of solder per unit bump cross sectional area) when the dimension of the bumps approach the dimension of individual solder spheres.

To eliminate this problem, solder flux instead of solder paste patterns were printed on the substrates if solder bumps were initially fabricated on individual monolithic microwave integrated circuits. This invention is disclosed in copending U.S. patent application Ser. No. 08/803,656, filed Feb. 21, 1997, entitled "Flip Chip Monolithic Microwave Integrated Circuit with Mushroom-Shaped, Solder-Capped Plated Metal Bumps", which is assigned to the assignee of the present invention. Using this alternative technique disclosed in this patent application, the bump size limitation imposed by the size of solder spheres was removed.

The improved flip chip attachment method 30 and monolithic microwave integrated circuit module 10 of the present invention requires the fabrication of solder caps 12 on top of plated thermal bumps 13, such as silver bumps 13, positioned directly on top of active circuit elements 18 (transistors). At present, the electrolytic plating technique for use with lead-indium solder is in its infancy. A method for plating a constant composition, lead-indium solder is not commercially available. However, lead-tin plating techniques are well established. One can take full advantage of the more advanced lead-tin solder techniques if a suitable substrate metallization scheme is provided. This substrate metallization scheme is provided by the present invention.

In the present invention, a copper based MMIC substrate metallization scheme is provided. Referring again to FIG. 1, a top surface of the substrate 14 has a layer of copper 21 disposed thereon which is etched or otherwise processed to produce a metallization pattern on the substrate 14. The exposed surface of the layer of copper 21 is covered with a protective layer 22 comprising a thin layer of titanium 22 (for example, 200 to 1000 Angstroms) except for predefined areas 23 designated for solder patterns. The surface of the layer of titanium 22 is oxidized, once it is exposed to air. To provide the predefined areas 23, vias 16 or openings 16 are formed 36 in the oxidized protective layer 22.

The oxidized layer of titanium 22 serves as a solder dam during flip chip attachment of the integrated circuits 11 to the substrate 14, confining solder to the desired areas 23. As an option, the exposed surface of the layer of copper 21 (the areas 23 where the layer of titanium 22 is removed) may be protected by depositing a very thin coating or layer of nickel 24 followed by a thin layer of gold 25, both deposited using an electroless plating process. The thickness of the layers of nickel 24 and gold are each about 200–300 Angstroms. The amount of gold 25 in the very thin protective coating of nickel 24 and gold 25 does not cause the lead-tin solder to become brittle, yet it protects the copper circuitry formed by the layer of copper 21 from the ambient environment.

The present invention thus enables the use of flip chip integrated circuits with plated lead-indium (Pb/In) solder caps to be connected to the substrate 14. The present invention permits the use of smaller bumps and smaller size chips, and provides for improved flip chip attachment process control, resulting in higher microwave module yields and lower manufacturing costs.

The thin layer of titanium 22 on top of the copper circuitry defined by the layer of copper 21 may be replaced by a titanium/tungsten film, a chromium film, or an aluminum film as an option, as long as the thin film can function as both a solder dam and protective coating for the copper circuitry to protect the layer of copper 21 from oxidation.

Figure 2:
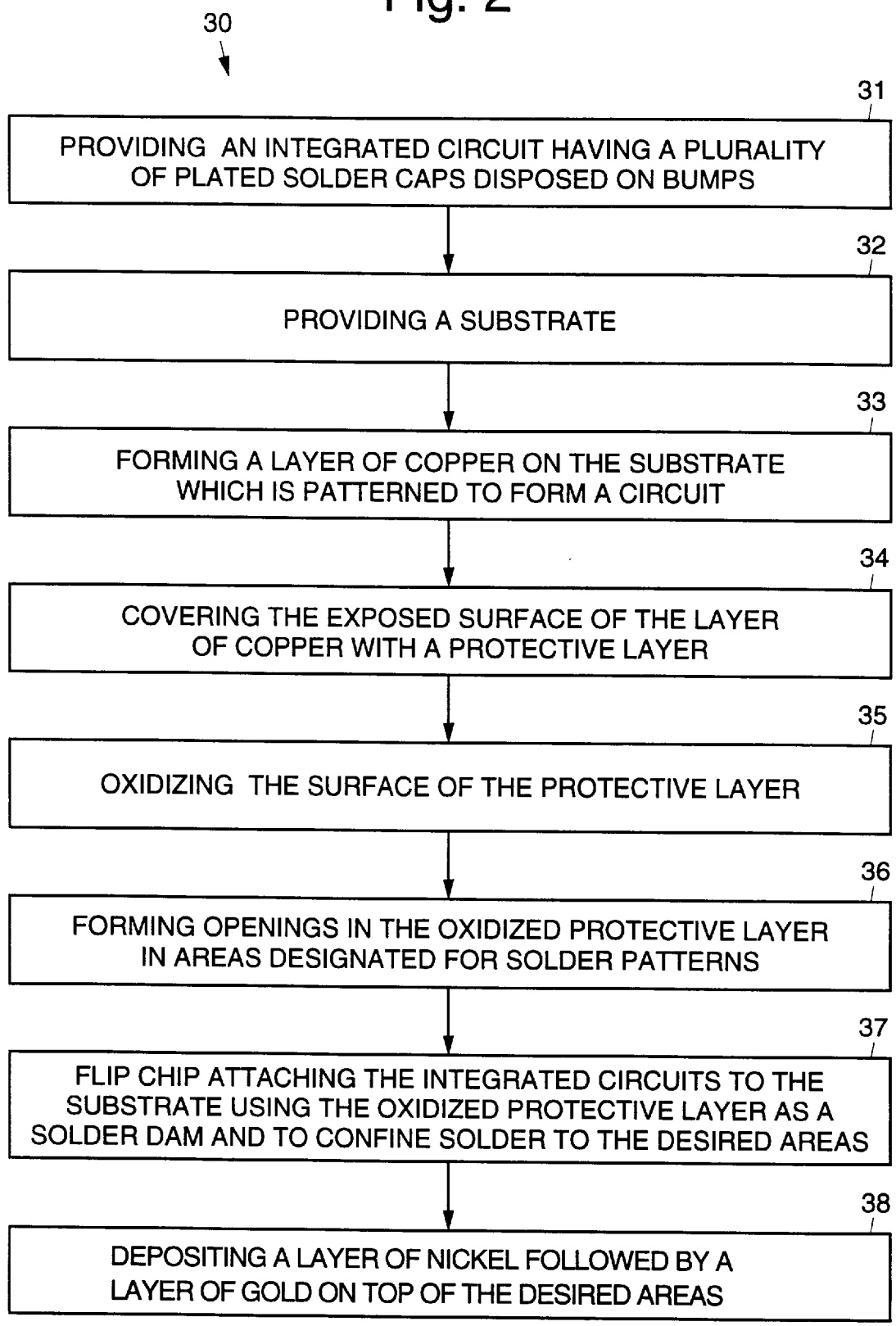
FIG. 2 is a flow diagram illustrating the present method.

For the purposes of completeness, FIG. 2 is a flow diagram illustrating details of the present method 30 which is used to attach a flip chip microwave module integrated circuit 11 to a copper coated substrate 14. The method 30 comprises the following steps. An integrated circuit 11 having a plurality of plated solder caps 12 disposed on silver bumps 13 are provided 31. A substrate 14 is provided 32. A layer of copper 21 is formed 33 on the substrate 14 which is patterned to form a circuit. The exposed surface of the layer of copper 21 is covered 34 with a protective layer 22, except for areas 23 designated for solder patterns.

The surface of the protective layer 22 is oxidized 35 once it is exposed to air. To provide the areas 23, vias 16 or openings 16 are formed 36 in the oxidized protective layer 22. The protective layer 22 may be a thin layer of titanium 22, for example.

The protective layer 22 may be any thin film that functions as both a solder dam and protective coating for the layer of copper 21 to protect it from oxidation. The protective layer 22 may comprise a thin layer of titanium 22, titanium/tungsten, chromium, or aluminum. Typically, if a layer of titanium 22 is used, it has a thickness of from 200 to 1000 Angstroms, for example. The integrated circuits 11 are then flip chip attached 37 to the substrate 14 and the oxidized protective layer 22 (layer of titanium 22) is used as a solder dam and to confine solder to the desired areas 23. The desired areas 23 may be protected by depositing 38 a very thin coating or layer of nickel 24 followed by a thin layer of gold 25, both deposited using an electroless plating process.

Thus, a monolithic microwave integrated circuit module fabricated using tin based (Pb/Sn) solder technology and a method of fabricating same has been disclosed. It is to be understood that the described embodiment is merely illustrative of some of the many specific embodiments which represent applications of the principles of the present invention. Clearly, numerous and other arrangements can be readily devised by those skilled in the art without departing from the scope of the invention.

What is claimed is:

1. Flip chip monolithic microwave integrated circuit apparatus comprising:

a microwave assembly substrate onto which an integrated circuit is connected comprising a layer of copper disposed on a surface that has a metallization pattern that forms a circuit that is to be connected to the integrated circuit, an oxidized protective layer disposed on the layer of copper, the protective layer selected from a group of metals consisting of titanium, titanium/tungsten, chromium and aluminum, and openings disposed in the oxidized protective layer in predefined areas designated for solder patterns; and an integrated circuit having a plurality of plated solder caps disposed on thermal bumps that are soldered to the substrate at the predefined areas designated for solder patterns.

2. The apparatus of claim 1 further comprising a thin layer of nickel and a thin layer of gold deposited on the predefined areas not covered by the oxidized protective layer.

3. The apparatus of claim 2 wherein the layer of titanium has a thickness between 200 to 1000 Angstroms.

* * * * *